United States Patent [19]

Robinson

[11] Patent Number: 4,616,731

[45] Date of Patent: Oct. 14, 1986

[54] SPEAKER SYSTEM

[76] Inventor: James R. Robinson, 6001 W. Indianapola, Phoenix, Ariz. 85033

[21] Appl. No.: 585,828

[22] Filed: Mar. 2, 1984

[51] Int. Cl.[4] ................................................ H05K 5/00

[52] U.S. Cl. .................................... 181/148; 181/153; 181/155; 181/199

[58] Field of Search ........................ 181/145, 152–156, 181/159–161, 196–199, 184, 185, 189–191, 22, 148; 179/181 R, 115.5 R

[56] References Cited

U.S. PATENT DOCUMENTS

| | | | |
|---|---|---|---|
| 2,193,398 | 3/1940 | Fisher | 181/154 |
| 3,108,653 | 10/1963 | Valldeperas | 181/150 |
| 3,517,390 | 6/1970 | Whitehead | 181/160 X |
| 3,547,220 | 12/1970 | Watson | 181/199 X |
| 3,993,162 | 11/1976 | Juuti | 181/153 X |
| 4,379,213 | 4/1983 | Lehnhardt | 181/160 X |

*Primary Examiner*—Benjamin R. Fuller
*Attorney, Agent, or Firm*—Don J. Flickinger; Jordan M. Meschkow

[57] ABSTRACT

An improved speaker system includes an open tube arrangement operated in conjunction with one or more closed tube components. The system includes a speaker having a frontal side which is positioned proximate an inlet end of an open primary tube. The tube may be provided with a plurality of apertures therethrough along the length thereof for the creation of even harmonic overtones. These apertures may be equally or unequally spaced as desired. Slits are provided at opposite ends of the primary tube and first and second additional tubes each close at one end surround opposite ends of the primary tube including the intensify base notes and enhance the fundamental wave lengths and odd harmonic overtones.

17 Claims, 7 Drawing Figures

SPEAKER SYSTEM

BACKGROUND

1. Field of the Invention

This invention relates generally to speaker systems, and more particularly, to an improved speaker system which produces superior harmonic sound through the addition of an open tube arranged to work in conjunction with a single or double closed tube.

2. Prior Art

Speaker systems now in commercial use fall into one of five categories; ie. closed box systems with variations, ported box systems with variations and/or ducts, labyrinth systems with variations, horns and variations thereof, and flat baffles with variations.

In the closed box speaker system (ie single closed tube), the speaker itself serves as a shallow disk closed pipe which emits frontal primary sound. The enclosed cabinet behind the speaker serves as a resonator, air spring, and a secondary closed system. While this system is generally considered to be a single closed tube system, it may in effect be considered as comprising two closed tube systems working in conjunction with each other.

In the ported box speaker system (ie double closed tube back-to-back system), the speaker itself serves as a closed tube sound emitter which operates in conjunction with a vented cabinet which also serves as a closed tube and resonator which may be tuned. This closed tube system (ie the vented cabinet) operates from the rear of the speaker.

Labyrinth box speaker systems (also double closed tube systems back to back) are constructed to consist of two closed tube systems arranged back to back. The speaker is the primary closed tube sound generator and the labyrinth case construction operates from the rear of the speaker as the secondary closed tube system.

Both the labyrinth and ported tube systems can operate in conjunction with a ducted tube port; however, both of these continue to structually represent only a primary and secondary closed tube system operating back to back and in conjunction with each other.

Horns act as accoustical transformers having flared sides so as to permit sound wave expansion at a constant rate. However, since it may be necessary to provide a horn of up to 30 feet in length, horns are folded for use in stereos. Essentially, the horn (and straight sided megaphone) is simple an extension of a closed tube system.

In addition to the above, another commercial speaker arrangement consists of a tube having a speaker inserted therein. It should be clear that this merely represents a double closed tube system. The tube in front of the speaker is only an extension of the closed tube speaker while the tube behind the speaker is only a secondary closed tube system.

SUMMARY OF THE INVENTION

It is an object of the present invention to provide an improved speaker system.

It is a further object of the present invention to provide an open tube speaker system including a closed tube component which produces significant sound intensification and a full range of harmonic overtones.

It is a still further object of the present invention to provide an improved speaker system which produces superior harmonic sound compared to all closed tube systems.

Still another object of the present invention is to provide a speaker system with significantly increased sound intensification through non-electronic means without perceptible distortion at either high or low frequencies or volumes.

Yet another object of the present invention is to provide an improved speaker system wherein an open tube is positioned in front of a speaker.

Still another object of the present invention is to provide an improved speaker system wherein the speaker is placed outside of the accoustical resonator cabinet.

According to a broad aspect of the invention there is provided a speaker having a frontal side, a tube having one open inlet portion and at least one open outlet portion, said inlet portion being positioned adjacent the frontal side of said speaker for receiving sound waves therefrom, and a first means proximate said speaker for permitting the passage of air into said tube.

The above, and other objects, features and advantages of the present invention will be more clearly understood from the following detailed description taken in conjunction with the accompanying drawings, in which:

DESCRIPTION OF THE PREFERRED EMBODIMENT

Figure 1:
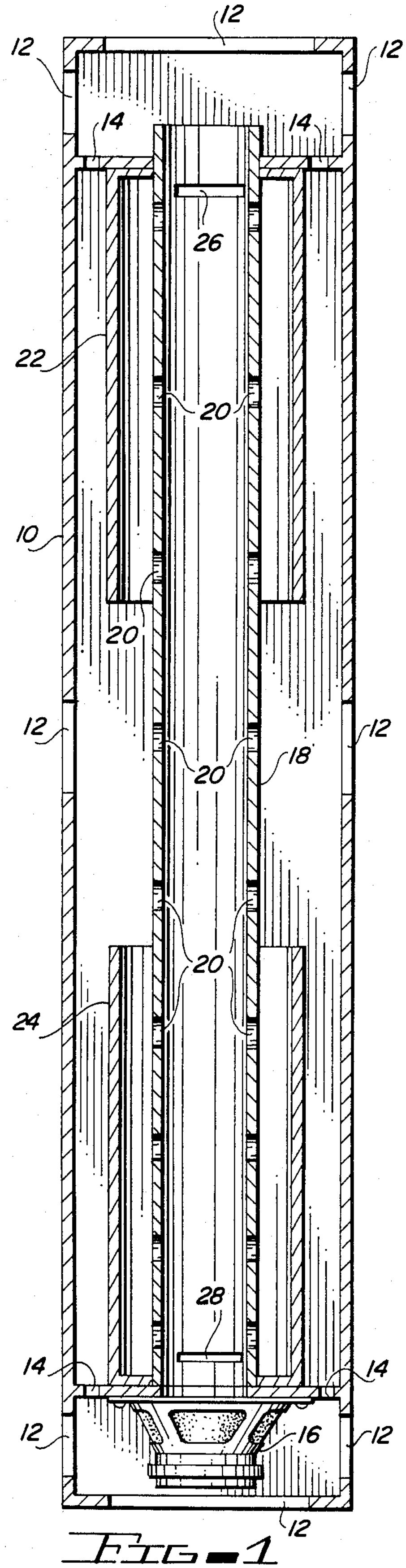
FIG. 1 is a cross-sectional view of a speaker system in accordance with the present invention.

The inventive speaker system as shown in FIG. 1 includes a cabinet enclosure 10 which supports the remainder of the speaker system. Cabinet 10 is provided with a plurality of cloth covered sound apertures 12 for sound dispersal. Additional apertures 14 provide for a system air/sound circulation.

A speaker 16 is mounted in cabinet 10 and faces the opening of a long tube 18 (e.g. PVC tube) open at both ends. Tube 18 is provided with a plurality of small apertures 20 therethrough which transfer the tube into a series of linked short double open ended tubes. Apertures 20, in addition to effecting different tone frequencies, serves to release the lower base sound frequency pressures which tend to build up in the central portion of tube 18. Apertures 20 may be equally spaced along the tube or positioned in any other manner such as non-equal spacing or spirally along the length of the tube.

As can be seen, two additional tubes 22 and 24 each of which are stopped at one end and open at the other surround a portion of the length of primary tube 18. The presence of these tubes 22 and 24 increases intensification, lowers the sound by one octave, intensifies base notes, enhances fundamental wave length and odd harmonic overtones, and acts as a resonator chamber. Similarly, primary tube 18 provides for sound intensification, serves as a sound resonator chamber, enhances the primary fundamental wave and any odd harmonic overtones, creates even harmonic overtones, and serves to funnel speaker sound to the chambers formed between tube 18 and closed end tubes 22 and 24.

As can be seen, tube 18 is provided with a slit 26 through its wall at an end remote from speaker 16. This creates an open tube effect and directs sound into the closed or stopped tube 22. Alternatively, slot 26 could be replaced by a single hole or a series of smaller holes circumventing the primary tube. Similarly, a slit 28 through the wall of primary tube 18 is found at the end of primary tube 18 closest to speaker 16. This functions in the same manner as does slit 26, and in addition creates a critical opening for the primary central tube which is necessary for the production of odd and even harmonic overtones. Slit 28 directs sound into closed or stopped tube 24.

Figure 2:
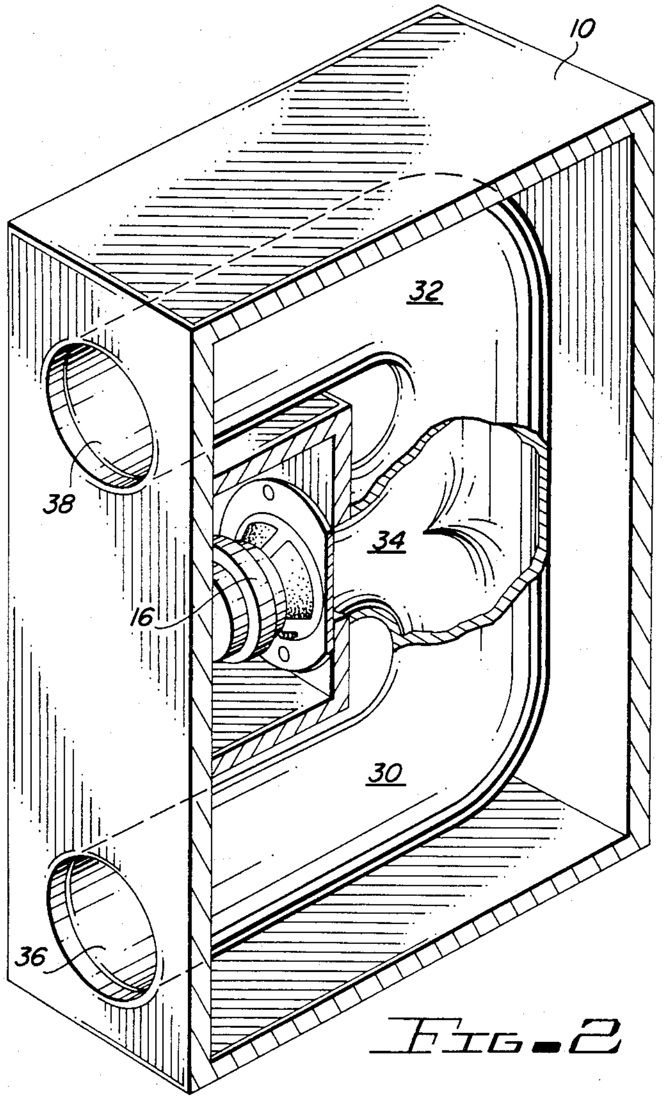
FIG. 2 is a perspective cross-sectional view of a second embodiment of speaker system in accordance with the teachings of the present invention.

FIG. 2 illustrates another form of speaker system in accordance with the present invention. Like elements are denoted by like reference numbers. Here it can be seen that speaker 16 is mounted so as to face the rear of cabinet 10. The primary open ended tube in this case contains first and second areas 30 and 32 which join at a single input 34 which receives sound from speaker 16. Arms 30 and 32 then curve and exit at openings 36 and 38 respectively in the front of the cabinet. Thus, while the speaker faces the rest of the cabinet, the sound is direced out through the front of the cabinet.

Figure 3:
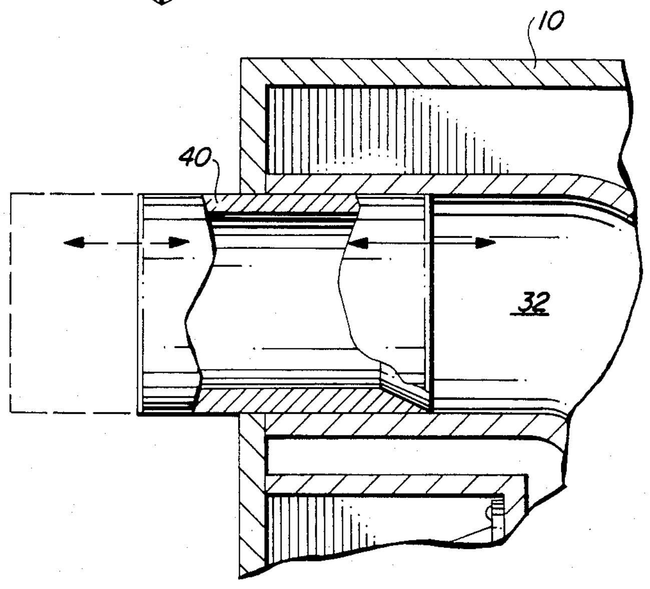
FIG. 3 is a cross-sectional view illustrating an improvement to the speaker system shown in FIG. 2.

Telescoping pipe inserts 40 such as shown in FIG. 3 extend the length of each arm 30 and 32 significantly increase the resonance of the system.

Figure 4:
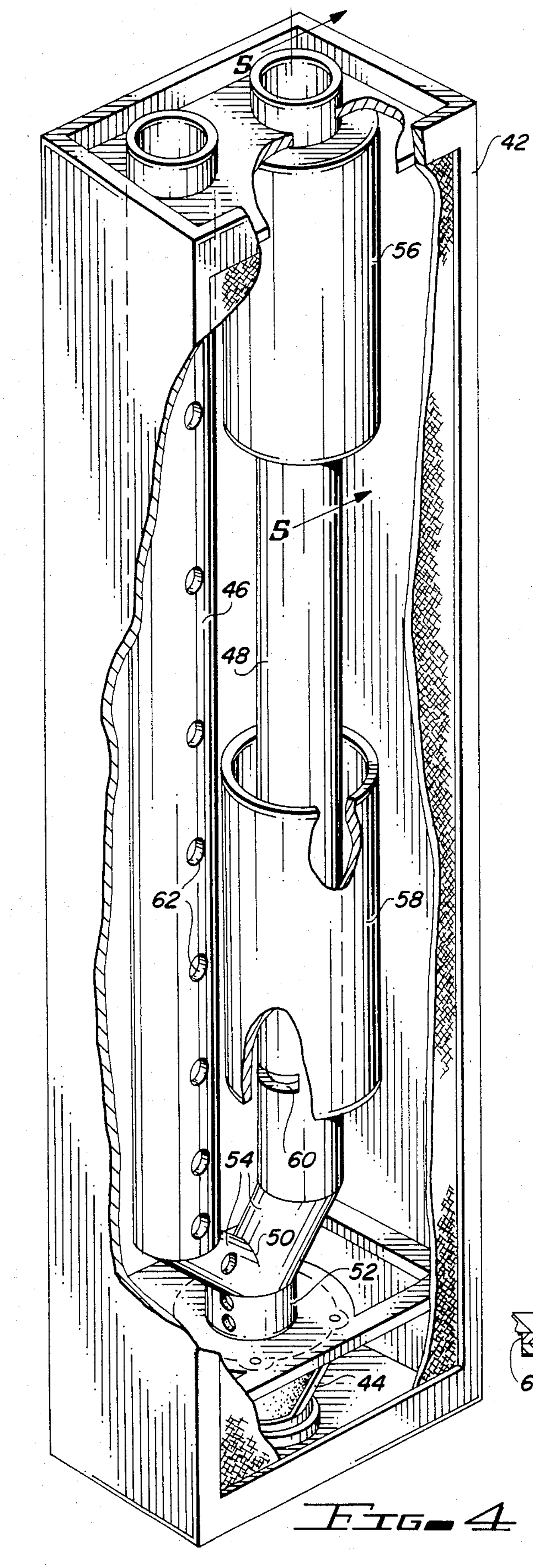
FIG. 4 illustrates a still further embodiment of the present invention.

FIG. 4 illustrates an alternate, more complex embodiment of the inventive speaker system. As was the case in FIG. 1, the arrangement shown in FIG. 4 includes a cabinet 42 in which a speaker 44 is mounted. First and second open tubes 46 and 48 are coupled to receive sound emitted from speaker 44 by means of a Y-shaped connecting tube 50 having an inlet portion 52 and first and second outlet portions 54. Tube 48 is provided, as is the case in FIG. 1, with first and second closed tubes 56 and 58 for reasons previously discussed. Open tube 48 is also provided with slits 60 at its upper and lower ends (only the lower one being shown). As was stated previously, the use of stopped closed tubes lowers the sound by one octave and enhances base notes. Therefore, open tube 48 in conjunction with closed tubes 56 and 58 may function as a base tube while open tube 46 functions as a treble tube. Tube 46 is provided with a plurality of apertures 62 along its length for reasons described in the description of the FIG. 1 device. Again these apertures may be equally spaced along the length of the tubes towards speaker 44 or may be positioned in any other desired manner.

Figure 5:
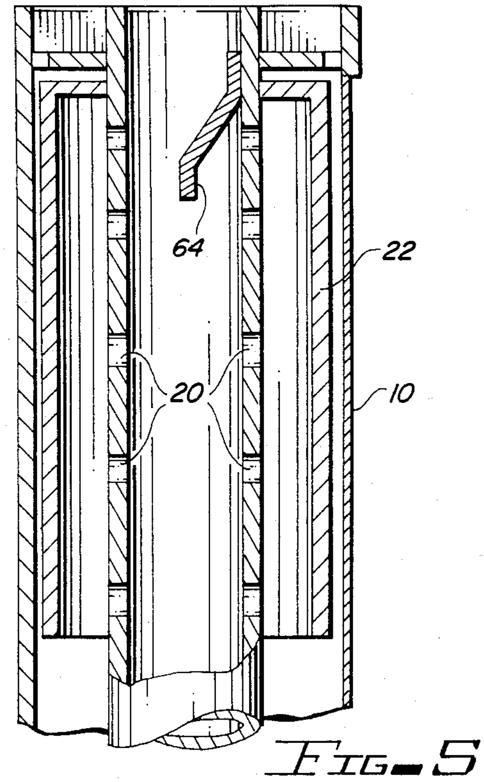
FIG. 5 is a cross-sectional view illustrating a speaker system in accordance with the present invention utilizing the baffle.

FIG. 5 illustrates that a baffle 64 may be associated with some or all of openings 20. The baffles divert and guide the sound through the apertures to create a multiple tube effect for generation of high frequency harmonic overtones in the even portion of the sound spectrum.

Figure 6:
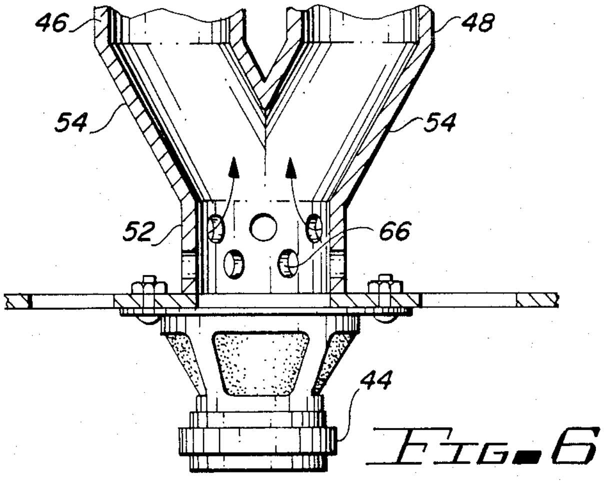
FIGS. 6 and 7 illustrate still further embodiments of speaker systems constructed in accordance with the present invention.
Figure 7:
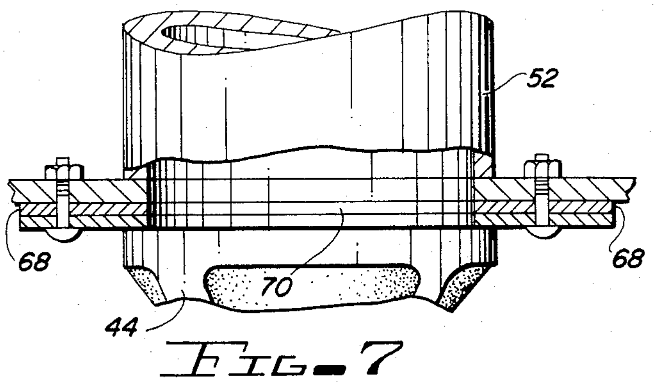

Referring now to FIG. 6, it can be seen that instead of slot 60, a plurality of apertures 66 may be utilized in the input section 52 of Y-shaped tube 50. In FIG. 7, neither apertures nor slits are employed but the output plane of speaker 44 is spaced from the input plane of section 52 through the use of spacers 68. This leaves a gap 70 through which air may be introduced into tube section 52.

The inventive speaker system described above incorporates the application of harmonic overtone open tube accoustical principles for the creation of even harmonics combined with an electrical speaker transducer and secondary closed tubes which enhance the production and intensification of low frequency base tones. This is based on the principle that closed or stopped tube systems lower the pitch of sounds by a complete octave. A series of single or multiple hole openings appear along the length or circumference of the primary open tube components to create the function and effect of tuning for pitch alterations and creating even harmonic overtones. These apertures also serve to release the vibrating air column. This system of interactive apertures direct and maximize air flow throughout the complete system and between the components thereof for maximum accoustical and resonant effects. Multiple accoustical sound and resonator chambers separate portions of the inner spaces of the primary speaker system cabinet and the complete external cabinet which holds the components. Structurally, the improved speaker system provides at least three sound openings in the exterior accoustical cabinet which permits omni directional sound dispersion into the environment.

Sterephonic effects are provided from a unit embodying only one electrical speaker transducer and the effects are greatly enhanced by using paired or multiple speaker units. The unique design of the inventive speaker system eliminates accoustical distortions of low frequency base boom, echo effects, and rumble which are commonly found in closed tube systems. The slots or other apertures in the open tubes increase and extend the lengths of the primary tubes and then adds to the spectrum of odd/even harmonic overtone production.

While closed tubes serve to lower the pitch of a sound by one octave from the fundamental, the inventive system generates simultaneously the lower octave closed tube sounds, the higher octave sounds of the open tube and a middle tone created by the combination or resultant tones due to the combination of the two different tubes. This sound interaction also creates harmonic overtones as a result of the separate pipe generated sounds acting on each other.

The above description is given by way of example only. Changes in form and details may be made by one skilled in the art without departing form the scope of the invention as defined by the appended claims:

I claim:

1. An improved speaker assembly, comprising:

a speaker having a frontal side;

a tube having one open inlet portion and at least one open outlet portion;

first means proximate said speaker for permitting the passage of air into said tube; and second means coupled to said speaker and to said tube for positioning said inlet portion adjacent the frontal side of said speaker so as to receive sound waves therefrom.

2. An improved speaker system according to claim 1 wherein said means comprises an aperture in said inlet portion of said tube proximate said speaker.

3. An improved speaker assembly according to claim 1 wherein said aperture is in the form of a slit.

4. An improved speaker assembly according to claim 3 wherein said first means includes at least one additional aperture in the inlet portion of said tube proximate said speaker.

5. An improved speaker assembly according to claim 1 wherein said means comprises a space between the frontal side of said speaker and the opening of inlet portion.

6. An improved speaker assembly according to claim 1 further comprising a plurality of apertures in said tube along the length thereof for producing even harmonic overtones.

7. An improved speaker assembly according to claim 6 wherein said plurality of apertures are equally spaced along the length of said tube.

8. An improved speaker assembly according to claim 6 wherein said plurality of apertures are unequally spaced along the length of said tube.

9. An improved speaker assembly according to claim 6 further comprising a second tube surrounding the inlet portion of said first tube and the slot therein, said second tube having a closed end proximate said speaker and an open end remote from said speaker.

10. An improved speaker assembly according to claim 9 further comprising:

an additional aperture in the outlet end of said tube; and a third tube surrounding said outlet portion and said additional aperture, said third tube having a closed end remote from said speaker and an open end closer to said speaker.

11. An improved speaker assembly according to claim 1 wherein said tube has first and second outlet portions extending from a single inlet portion, said first and second outlet portion have a first and second outlets respectively, said first and second outlets, facing in a direction opposite the frontal side of said speaker.

12. An improved speaker assembly according to claim 11 further comprising first and second telescoping pipe members slidingly coupled on said first and second outlet portions so as to vary the length thereof.

13. An improved speaker assembly according to claim 6 wherein the interior of said tube is provided with the plurality of baffle each located adjacent one of said apertures so as to divert and guide sound through said apertures.

14. An improved speaker assembly according to claim 13 wherein said tube has a first inlet portion and first and second outlet portions having first and second outlets respectively.

15. An improved speaker assembly according to claim 14 wherein said first outlet portion has a plurality of apertures therein for the generation of even harmonic overtones.

16. An improved speaker assembly according to claim 15 further comprising:

first and second apertures inset second outlet portions, said first aperture being proximate said inlet portion and second aperture remote from said inlet portion;

a second tube surrounding a portion of said second outlet portion including said first aperture, said second tube having a first closed end proximate said inlet portion; and a second tube surrounding a portion of said second outlet portion including said second aperture and having a closed end remote from said inlet portion.

17. An improved speaker assembly, comprising:

a speaker having a frontal side;

a tube having one open inlet portion and at least one open outlet portion;

first means coupled to said speaker and to said tube for positioning said inlet portion adjacent the frontal side of said speaker so as to receive sound waves therefrom; and an aperture in said inlet portion of said tube proximate said speaker for permitting the passage of air into said tube.

* * * * *